(12) United States Patent
Yamashita

(10) Patent No.: US 7,573,363 B2
(45) Date of Patent: Aug. 11, 2009

(54) COMMUNICATION TRANSFORMER FOR POWER LINE COMMUNICATION

(75) Inventor: Akihiro Yamashita, Miyaki-gun (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/986,173

(22) Filed: Nov. 12, 2004

(65) Prior Publication Data

US 2005/0162237 A1 Jul. 28, 2005

(30) Foreign Application Priority Data

Nov. 12, 2003 (JP) ............ P. 2003-382189

(51) Int. Cl.
*H01F 27/28* (2006.01)
(52) U.S. Cl. .................. 336/229; 323/356
(58) Field of Classification Search ............ 336/229
See application file for complete search history.

(56) References Cited

U.S. PATENT DOCUMENTS

| | | | | |
|---|---|---|---|---|
| 2,553,324 A * | 5/1951 | Lord | ............ | 336/73 |
| 5,012,125 A * | 4/1991 | Conway | ............ | 307/149 |
| 5,150,046 A * | 9/1992 | Lim | ............ | 323/356 |
| 5,223,806 A | 6/1993 | Curtis et al. | | |
| 5,603,793 A | 2/1997 | Yoshida et al. | | |
| 5,731,740 A * | 3/1998 | van de Westerlo | ............ | 330/276 |
| 6,456,180 B1 * | 9/2002 | Moore | ............ | 336/90 |
| 6,965,303 B2 * | 11/2005 | Mollenkopf | ............ | 370/485 |

FOREIGN PATENT DOCUMENTS

| | | |
|---|---|---|
| JP | 56010907 | 2/1981 |
| JP | 59114808 | 7/1984 |
| JP | 60260119 | 12/1985 |
| JP | 04034909 | 2/1992 |
| JP | 7192926 | 7/1995 |
| JP | 7192962 | 7/1995 |
| JP | 2000244271 | 9/2000 |

* cited by examiner

*Primary Examiner*—Elvin G Enad
*Assistant Examiner*—Joselito Baisa
(74) *Attorney, Agent, or Firm*—Dickinson Wright, PLLC

(57) ABSTRACT

A communication transformer for power line communication includes a magnetic core, a plurality of transfer-purpose windings wound on the magnetic core, and an additional winding. The additional winding is wound on the magnetic core in such a manner that the additional winding is positioned between the plurality of transfer-purpose windings, and does not contribute in signal transfer operations. The communication transformer is arranged such that a half way portion of the additional winding along a length direction thereof is electrically connected to a constant potential.

20 Claims, 14 Drawing Sheets

COMMUNICATION TRANSFORMER FOR POWER LINE COMMUNICATION

BACKGROUND OF THE INVENTION

The present invention is related to a communication transformer employed in a LAN, or the like, in which a non-shielded twisted pair cable is used as a transmission path so as to perform a communicating operation. More specifically, the present invention is directed to a communication transformer which is employed in a power line communication, while the power line is used as a communication medium.

Recently, non-shielded type twisted pair cables are mainly utilized as transfer media for LANs (Local Area Networks). In connection with high transfer speeds, there is a problem that noise is radiated from the above-described transfer media. More particularly, in electric power line communications in which electric power lines are employed as transfer media, since such media (namely, electric power line) which has not been originally designed as communication paths is used as these communication paths, noise suppressing solutions are strongly requested.

In general, common-mode noise mainly constitutes noise radiation from balanced transfer paths such as twisted pair cables and parallel electric cables, while the common-mode noise is produced between the transfer paths and the ground. As a result, signals have been transmitted to the transfer paths via communication transformers having superior common-mode noise rejection performance. To this end, such a method has been conceived. That is, a winding which constitutes a shielded line is added between windings of a communication transformer, so that common-mode rejection performance of the communication transformer is improved (refer to, for example, Japanese Laid-open Patent Application No. Hei-7-192962).

FIG. 14 is a structural diagram of a communication transformer in the conventional technique. That is, a pulse transformer (broad-band communication transformer) which is used in a communication module for 10BASE-T has been described. FIG. 15 is an equivalent circuit diagram of the communication transformer in the prior art. A primary winding 16, a secondary winding 17, and an additional winding 18 are wound on a core 15, while any one of additional winding terminals 19 and 20 of the additional winding 18 is grounded. Since such an arrangement is employed, stray capacitances produced between the primary winding 16 and the secondary winding 17 are reduced so as to decrease the common-mode noise which is propagated between the primary winding 16 and the secondary winding 17.

However, in the conventional method, there is such a problem that since the additional winding 18 is grounded, the electrical balance of the transformer is lowered. This reason is given as follows. That is, as shown in FIG. 15, an impedance of the primary winding terminal 21 with respect to the ground becomes such a series connection made of the stray capacitance 23 and a resistor 25 owned by the additional winding 18 itself, whereas an impedance as viewed from the terminal 22 to the ground constitutes only the stray capacitance 24. As a result, there is a difference in the impedances at the primary winding terminal 21 and the terminal 22 with respect to the ground.

FIG. 16 is a conversion transfer loss performance diagram of the conventional communication transformer, namely, is represented by a graph. A longitudinal-direction conversion transfer loss is expressed in which a ratio of a normal mode signal appearing on the secondary side to a common-mode signal applied to the primary-sided transfer-purpose winding is plotted every frequency. In an ideal transformer case, no normal mode signal appears on the secondary side of this ideal transformer. However, in an actual transformer, since the electrical balance becomes a finite value, such a normal mode signal which has been converted from the common-mode signal appears on the secondary side of the actual transformer. As a consequence, FIG. 16 indicates such a performance that the larger the value of the longitudinal-direction conversion transfer loss is increased, the higher the electrical balance is increased, and the ratio for converting the common-mode signal to the normal mode signal is small. In FIG. 16, symbol "A" shows such a characteristic that the additional winding 18 is not grounded, and symbol "B" indicates such a characteristic that one terminal of the additional winding 18 is grounded. As explained above, when the additional winding 18 is grounded, the electrical balance is lowered, and thus, the normal mode signal which is converted from the common-mode signal to be transferred is increased. As a consequence, there is such a problem that the sufficiently high common-mode rejection performance cannot be essentially obtained.

SUMMARY OF THE INVENTION

A communication transformer, according to the present invention, includes a magnetic core; and a plurality of conductors which are provided on the magnetic core in a spiral shape and are mutually insulated from each other; in that the plurality of conductors includes: a plurality of transfer-purpose conductors for transferring a signal; and an additional conductor which does not transfer the signal; a half way portion of the additional conductor being connected to a constant potential.

In the communication transformer of the present invention, the additional winding provided between the transfer-purpose windings is employed as a shielded line, and also, the halfway portion of the additional winding is connected to the constant potential. As a result, there is such a merit that while the electrical balance of the transformer is not lowered, the high common-mode rejection ratio can be obtained. Also, since the impedance of the feedback path for the common-mode signal is lowered in the vicinity of the transfer signal frequency range, the larger amount of the common-mode signals can be fed back to the signal source side, so that there is an advantage that the high common-mode rejection ratio can be obtained.

DETAILED DESCRIPTION OF THE PREFERRED EMBODIMENTS

Embodiment modes of the present invention will now be described in detail with reference to drawings. It should be noted that transfer-purpose windings and an additional winding are involved in windings which are wound on a magnetic core. Also, electric conductors which are provided in a spiral shape on the magnetic core involve such windings as copper wires and covered wires which have been wound on the magnetic core, and involve electric conductors which have been formed by trimming electric conducting films of the magnetic core where the electric conducting films have been formed. In the below-mentioned explanations, windings which are wound on the magnetic core will be mainly described. A similar explanation may be applied to such an electric conductor which has been formed in such a manner that, for instance, while a surface of the magnetic core is covered with an electric conducting film, this electric conducting film is trimmed so as to form a spiral-shaped groove.

Embodiment Mode 1

Figure 1:
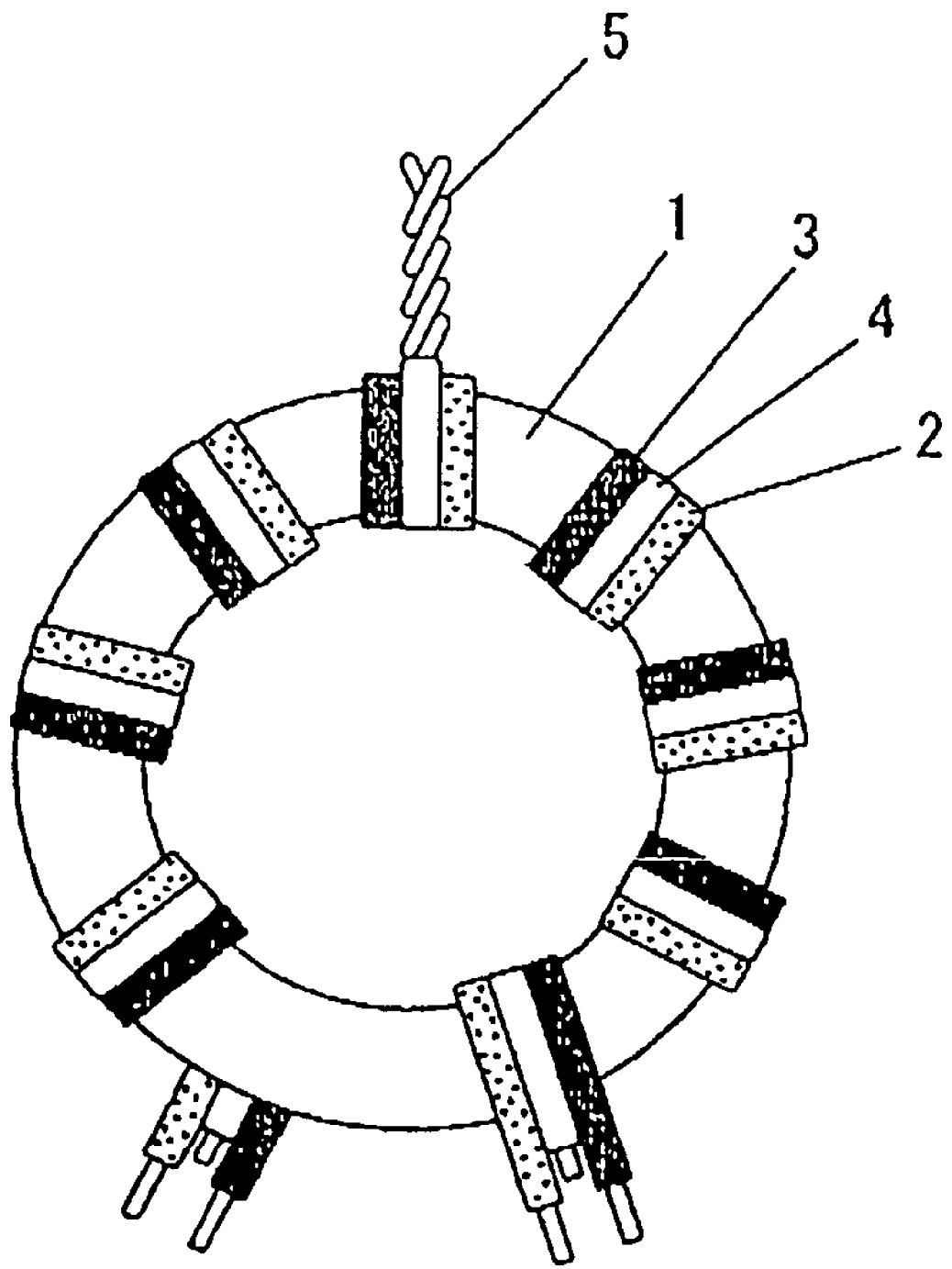
FIG. 1 is a front view of a communication transformer according to an embodiment mode 1 of the present invention.
Figure 2:
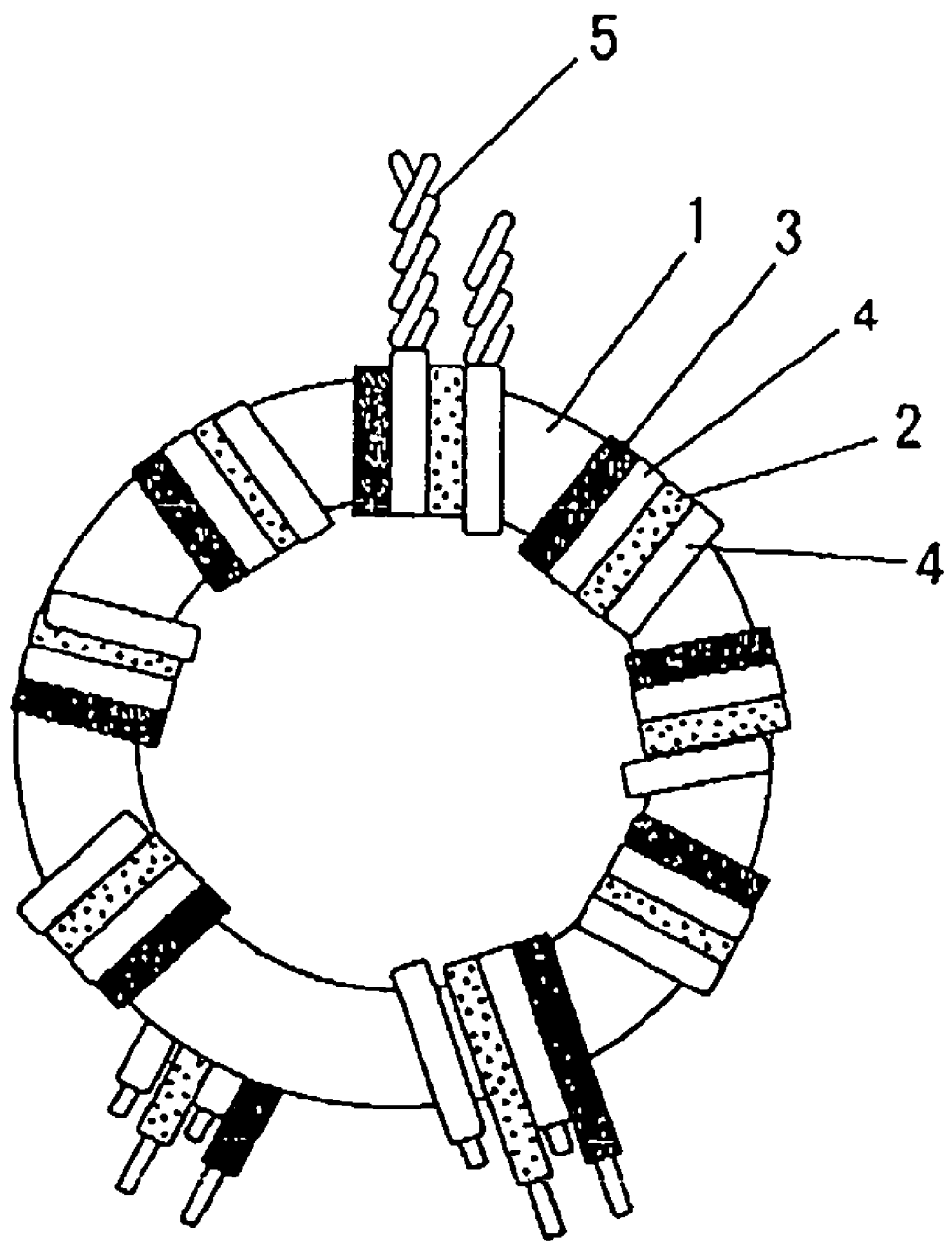
FIG. 2 is a front view of the communication transformer according to the embodiment mode 1 of the present invention.
Figure 3A:
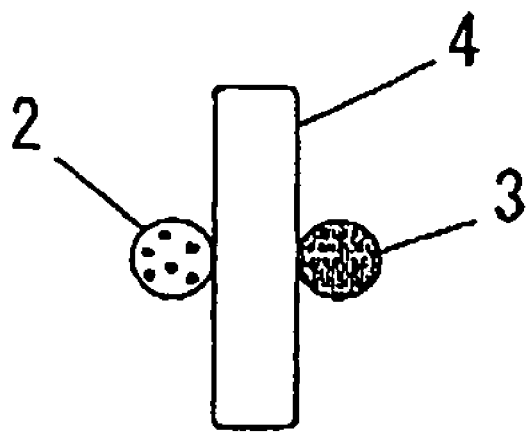
FIG. 3A is a sectional view for showing a winding in the embodiment mode 1 of the present invention.
Figure 3B:
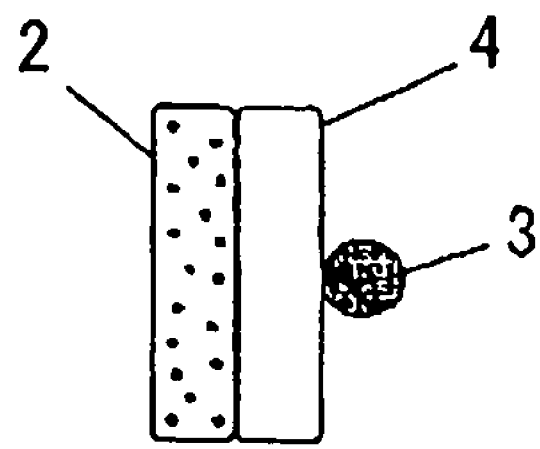
FIG. 3B is a sectional view for indicating the winding in the embodiment mode 1 of the present invention.
Figure 4:
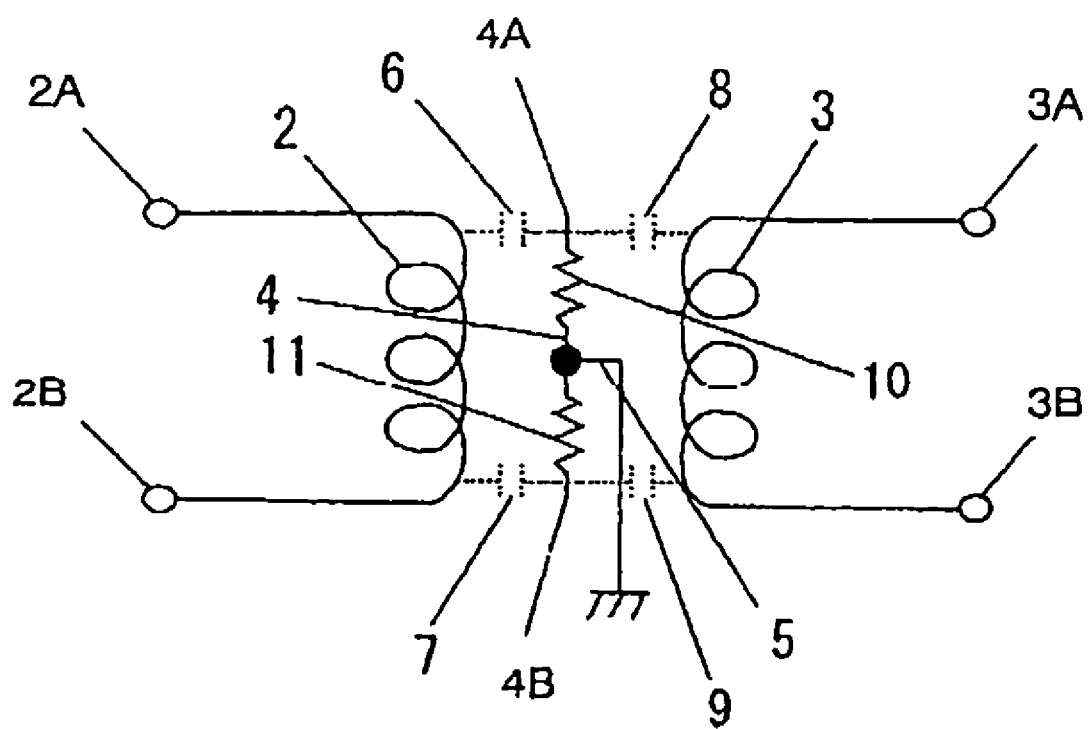
FIG. 4 is an equivalent circuit diagram of the communication transformer according to the embodiment mode 1 of the present invention.
Figure 5:
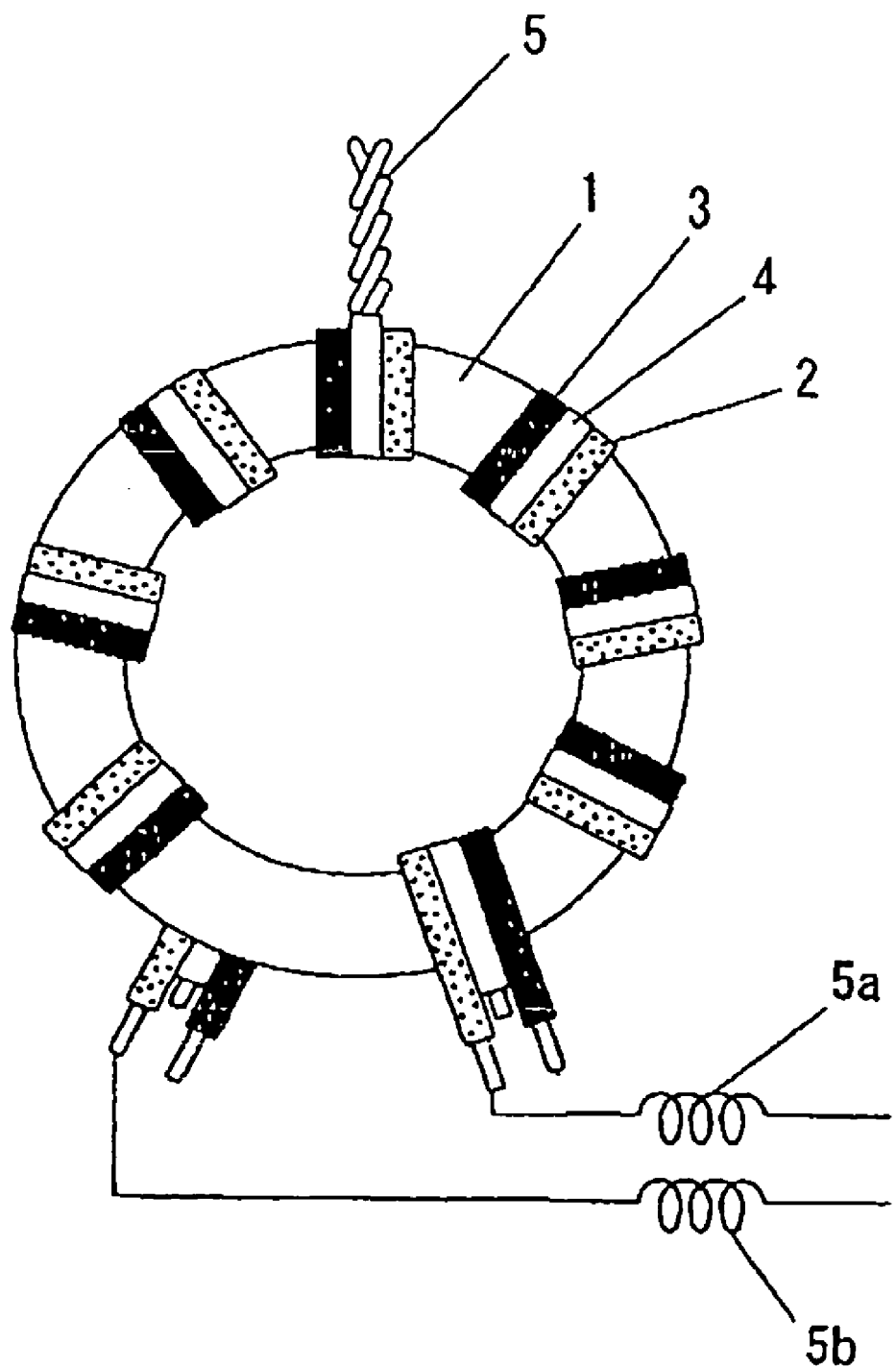
FIG. 5 is a front view of the communication transformer according to the embodiment mode 1 of the present invention.
Figure 6:
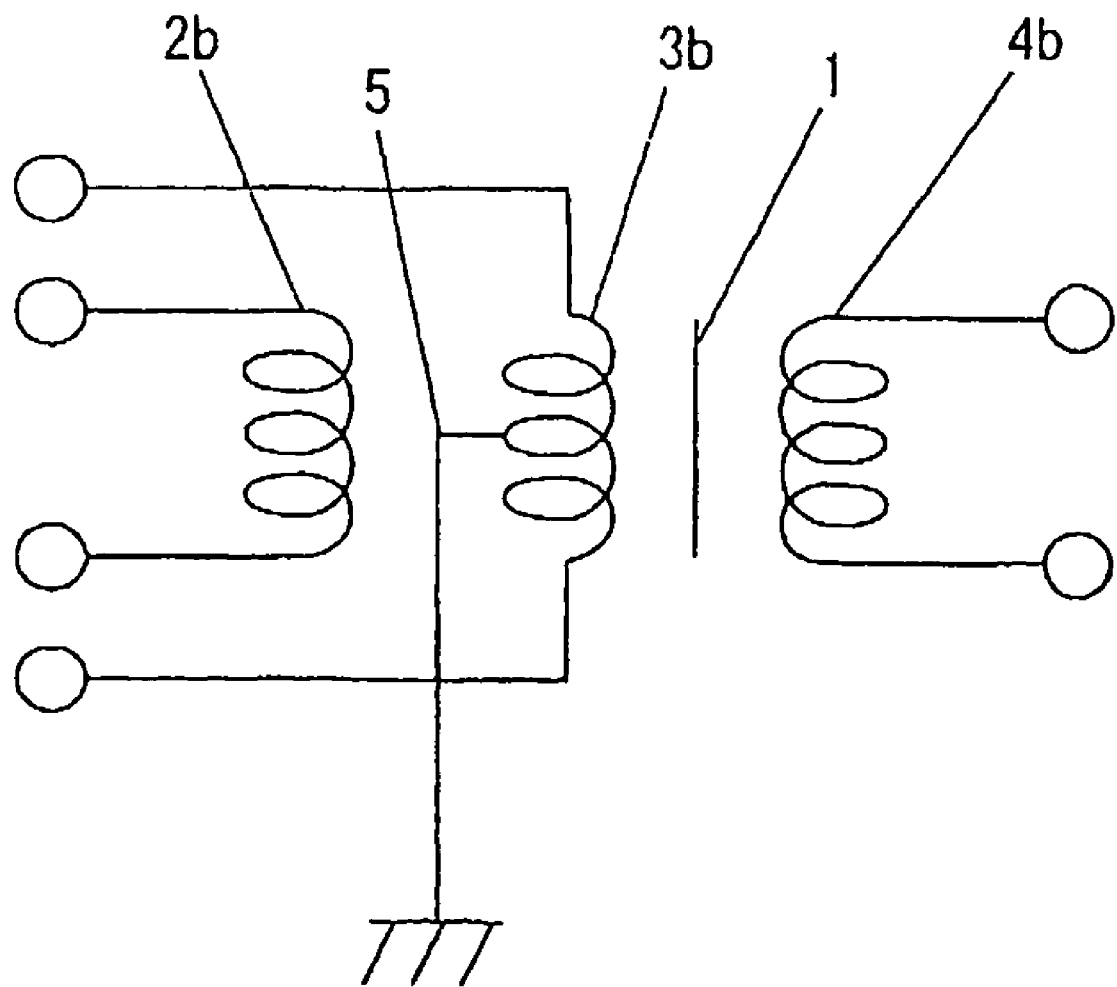
FIG. 6 is an equivalent circuit diagram of the communication transformer according to the embodiment mode 1 of the present invention.

FIG. 1, FIG. 2, and FIG. 5 are front views of a communication transformer according to an embodiment mode 1 of the present invention. FIG. 3A and FIG. 3B are sectional views of windings in the embodiment mode 1 of the present invention. FIG. 4 and FIG. 6 are equivalent circuits of the communication transformers. Reference numeral 1 shows a magnetic core, reference numerals 2 and 3 represent transfer-purpose windings, reference numeral 4 indicates an additional winding, and reference numeral 5 represents a center tap. Although the magnetic core 1 is represented as a ring-shape form, the magnetic core 1 may be alternatively represented as an ellipse shape, or a horseshoe shape. Also, the magnetic core 1 may be suitably manufactured by using a magnetic material such as ferrite. The transfer-purpose windings 2 and 3, and also, the additional winding 4 are constituted by an electric wire such as a covered copper wire and a cable wire. The additional winding 4 corresponds to such a winding which does not contribute in a signal transferring operation. The transfer-purpose windings 2 and 3, and the additional winding 4 are wound in such a manner that respective intervals can maintain equi-distances.

The communication transformer is arranged by that the transfer-purpose winding 2, the transfer-purpose winding 3, and the additional winding 4 are wound on the magnetic core 1 by the same turn numbers. The additional winding 4 is arranged between the transfer-purpose winding 2 and the transfer-purpose winding 3, and are wound in such a manner that distances among these windings 2 and 3 are made constant. In this case, any one winding of the transfer-purpose windings 2 and 3 corresponds to a primary-sided transfer-purpose winding of the transformer, and the other winding thereof corresponds to a secondary-sided transfer-purpose winding of this transformer. When a signal current flows through the primary-sided transfer-purpose winding, a magnetic field is generated in the magnetic core 1, and another signal current flows through the secondary-sided transfer-purpose winding by an induction current caused by this magnetic field, so that the signal may be transmitted.

In order to easily construct the communication transformer, this communication transformer may be realized in such a way that while a 3-wire condition has been previously formed under which the additional winding 4 is arranged between the transfer-purpose windings 2 and 3, this 3-wire condition of the windings is wound on the magnetic core 1 having the ring shape. It should also be noted that plural sets of the primary-sided transfer-purpose winding and plural sets of the secondary-sided transfer-purpose winding may be employed, if necessary. Since the 3-wire condition has been previously set and then the 3-wire condition of the windings are wound on the magnetic core 1, there is an advantage that while the distances between the transfer-purpose windings and the additional winding are maintained in the equi-distance, the entire windings can be wound on the magnetic core 1.

The magnetic core 1 is manufactured by the magnetic material such as ferrite. Although the ring-shaped magnetic core 1 is represented in FIG. 1, the magnetic core 1 need not be formed in such a ring shape, but may be alternatively formed in a horseshoe shape, or an EI core shape.

In this case, a center tap is provided at a halfway portion of the additional winding 4. As the position of this half way portion, such a position is preferable where an impedance of the additional winding 4 is subdivided by approximately half. As a result, if impedances in the additional winding 4 are uniformly distributed, then a position where the additional winding 4 is subdivided by two along the length direction thereof may be defined as the half way portion to which the center tap 5 is connected. For instance, in such a case that thicknesses of an additional winding are made different from each other and are not uniform, a position where an impedance of the additional winding is subdivided by two is set as the half way portion thereof. An electric conducting wire is drawn from the center tap 5, and then, is connected to a point having a constant potential. The constant potential to be connected may be realized by such a constant potential having an arbitrary voltage, alternatively, may be preferably realized by the ground potential in order to eliminate a circuit. In this alternative case, an extra circuit for maintaining the constant potential is no longer required, the additional winding 4 may be easily designed and may be manufactured in low cost. At this time, in order not to fluctuate the ground potential, it is desirable to secure a sufficient ground plane.

In FIG. 1, the winding whose halfway portion is connected to the constant potential has been explained as the additional winding which does not contribute in the signal transferring operation. Alternatively, for example, a half way portion of one of the transfer-purpose windings may be connected to the constant potential. For instance, while two sets of primary-sided transfer-purpose windings are provided, one set of the primary-sided transfer-purpose windings is used for the transmission purpose whereas the other set of the primary-sided transfer-purpose windings is used for the reception purpose, and a secondary-sided transfer-purpose winding is a transfer-purpose winding. In this case, the reception-purpose transfer-purpose winding may be alternatively arranged between other windings so as to be wound, and then, a center tap may be alternatively provided at a half way portion thereof, and also, this center tap may be alternatively connected to the constant potential.

Also, it is preferable to employ such an arrangement that, as represented in FIG. 2, two additional windings 4 are further arranged on outer sides of transfer-purpose windings 2 and 3 to be wound. As a result, the following merit may be achieved. That is, a stray capacitance may be lowered, and the stray capacitance is produced between the transfer-purpose windings 2 and 3 which are located adjacent to each other with a constant distance when these transfer-purpose windings 2 and 3 are wound. In particular, in such a transformer case that windings are wound on the magnetic core 1 by large turn numbers, such a stray capacitance may cause a problem. This stray capacitance is produced by that intervals between the adjoining windings naturally become narrow, and thus, the stray capacitance is produced between wound portions located adjacent to each other. In this case, if additional windings are also arranged on the outer sides of the transfer-purpose windings 2 and 3 and the half way portion thereof is connected to the constant potential, then a higher effect may be achieved.

Also, as shown in FIG. 3A, it is suitable to arrange that a sectional area of an additional winding 4 arranged between transfer-purpose windings 2 and 3 is made larger than sectional areas of the transfer-purpose windings 2 and 3. In this case, it is possible to further avoid that a stray capacitance is produced between the transfer-purpose windings 2 and 3. Further, not only the sectional area of the additional winding 4 is made large, as represented in FIG. 3A, but also a height of the sectional area of this additional winding 4 along the height direction is higher than heights of the transfer-purpose windings 2 and 3, so that this effect may be achieved.

Moreover, as indicated in FIG. 3B, while a contacting area of the transfer-purpose winding 2 is made equal to a contacting area of the additional winding 4, these contacting areas are made larger than a sectional area of the transfer-purpose winding 3. As a result, while a stray capacitance produced between the transfer-purpose windings 2 and 3 is lowered, a capacitance between the transfer-purpose winding 2 and the additional winding 4 is increased. There is an effect that a common-mode noise elimination is increased.

With employment of the above-described arrangement, the stray capacitance produced between the primary-sided transfer-purpose winding and the secondary-sided transfer-purpose winding can be decreased. Moreover, since the additional winding 4 is arranged by that the half way portion thereof is connected to the constant potential, such a conventional problem that the electrical balance of the transformer is lost can also be solved. These operations will now be explained in detail by employing FIG. 4 as to this effect.

In FIG. 4, the additional winding 4 is expressed as a shield which is arranged between the transfer-purpose windings 2 and 3, and the center tap 5 of a center portion of the shield is grounded as the constant potential. Reference numerals 2A and 2B are transfer-purpose winding terminals of the transfer-purpose winding 2. Reference numerals 3A and 3B are transfer-purpose winding terminals of the transfer-purpose winding 3. Reference numerals 4A and 4B are additional winding terminals of the additional winding 4. Reference numerals 6 and 7 are stray capacitances. These stray capacitances 6 and 7 correspond to such stray capacitances which are produced between the transfer-purpose winding 2 and the additional winding 4. Since the transfer-purpose winding 2 and the additional winding 4 are wound in such a manner that a distance between the transfer-purpose winding 2 and the additional winding 4 continuously becomes constant, the stray capacitance 6 and the stray capacitance 7 may become equal capacitance values. Reference numerals 10 and 11 are winding resistances. The winding resistance 10 corresponds to a resistor which is produced between the additional winding terminal 4A and the center tap 5. The winding resistance 11 corresponds to a resistor which is produced between the additional winding terminal 4B and the center tap 5. Since the center tap 5 is provided at the half way portion of the additional winding 4, distances from both the winding terminals 4A and 4B to the center tap 5 are equal to each other, so that the winding resistors 10 and 11 own equal resistance values, respectively.

Similarly, reference numerals 8 and 9 are stray capacitances. These stray capacitances 8 and 9 correspond to such stray capacitances which are produced between the transfer-purpose winding 3 and the additional winding 4. Since the transfer-purpose winding 3 and the additional winding 4 are wound in such a manner that distances between the transfer-purpose winding 3 and the additional winding 4 become equal to each other, the stray capacitance 8 and the stray capacitance 9 may become equal capacitance values.

As previously described, since the stray capacitances 6 and 7, and the winding resistors 10 and 11 are equal to each other, an impedance formed from the transfer-purpose winding terminal 2A by setting the ground potential as a reference is made equal to such an impedance formed from the transfer-purpose winding terminal 2B by setting the ground potential as a reference, so that lowering of a electrical balance caused by the ground potential can be prevented. Similarly, since the stray capacitance 8 is equal to the stray capacitance 9, an impedance formed from the transfer-purpose winding terminal 3A by setting the ground potential as a reference is made equal to such an impedance formed from the transfer-purpose winding terminal 2B by setting the ground potential as a reference, the high electrical balance of the communication transformer can be maintained. In other words, the impedance values produced between the primary-sided winding and the additional winding, and between the secondary-sided winding and the additional winding can be made equal to each other, since the transfer-purpose windings 2 and 3, and also, the additional winding 4 are wound in such a manner that the distances among these windings 2, 3, 4 become equal to each other, and the half way portion of the additional winding 4 is connected to the ground potential, so that lowering of the electrical balance can be prevented.

As previously explained, in accordance with the communication transformer of the present invention, the stray capacitance produced between the primary-sided winding and the secondary-sided winding is lowered, so that the common-mode noise can be eliminated. Furthermore, lowering of the electrical balance of the transformer can be avoided, and also, such an operation that the common-mode noise is converted into the normal mode signal which is transferred can be prevented. In other words, such a communication transformer which is optimally used in the communication medium operated under deteriorated communication condition can be obtained.

Next, a description is made of such an adjustment that a series-resonant frequency which is caused by an inductance and a capacitance by setting the ground terminal as a reference is adjusted to be in vicinity of a frequency range of signals transmitted via the communication transformer.

FIG. 5 indicates such a condition that an inductance element has been added to the transfer-purpose windings of the communication transformer explained in FIG. 1. In this drawing, reference numerals 5a and 5b indicate inductance elements which are connected to both the terminals of the transfer-purpose winding 2. It should also be understood that the inductance elements 5a and 5b may be alternatively realized by chip inductors, or coil inductors. Alternatively, these inductance elements 5a and 5b may be connected as a discrete element which is separately provided with respect to the communication transformer. Alternatively, these inductance elements 5a and 5b may be previously mounted in a module where the communication transformer is mounted.

While the inductance elements 5a and 5b own arbitrary inductances respectively, since these inductance elements 5a and 5b are connected to the transfer-purpose winding 2, these inductance elements 5a and 5b are series-connected to the stray capacitances produced between the transfer-purpose windings 2 and 3, and the additional winding 4 shown in FIG. 4. As a consequence, a resonant condition is satisfied by the inductance "L" and the capacitance "C", and thus, a series-resonant frequency defined by the "L" value and the "C" value is produced. Since this series-resonant frequency is adjusted in such a manner that this resonant frequency is approximated to the transfer frequency range for transferring the transfer signals via the communication transformer, the common-mode noise can be lowered, especially, in the transfer frequency range. There is a merit that the noise elimination in the desirable frequency of the transfer signals can be improved. As a consequence, the noise is sufficiently eliminated in the frequency range related to the transfer signals, and the noise is suppressed in a predetermined degree in other frequency ranges, so that the noise eliminations in the required frequency ranges can be furthermore improved.

Also, as the inductance elements 5a and 5b, a leakage inductance produced in the transfer-purpose winding 2 may be alternatively employed. The transfer-purpose winding 2 owns such a leakage inductance which is produced by the conductor itself for constituting the winding, or by winding the conductor. Thus, instead of connecting the inductance elements 5a and 5b to the communication transformer, this leakage inductance may be alternatively employed. Also, this leakage inductance may be alternatively employed in combination with these inductance elements 5a and 5b.

Furthermore, although not shown in the drawing, it is also suitable to arrange that since a capacitor element is connected to the additional winding 4 and the resulting additional winding 4 is connected to a constant potential, a capacitance value of this capacitor element is adjusted in such a manner that a series-resonant frequency defined by employing the capacitance of this capacitor element is approximated to the transfer frequency range. Also, in this case, there is such an effect that the noise eliminating effect in the transfer frequency range may be improved, and there is a merit that the adjusting range of the resonant frequency can be widened, as compared with the adjusting range of the resonant frequency obtained in the case that only the inductance elements 5a and 5b are employed.

It should also be noted that since the inductance elements 5a and 5b and the capacitance element have been previously adjustable, the resonant frequency may be adjusted 9 in the vicinity of the transfer frequency. In the case that a firm measuring operation can be carried out as to what a stray capacitance is formed only after a manufacturing operation, since resonant frequencies may be adjusted after the manufacturing operation, this pre-adjustment arrangement is suitable. For instance, while a chip inductor and a chip capacitor are employed, these chip inductor and chip capacitor are replaced by employing such chip inductors and chip capacitors, the element sizes of which are equal to each other, but the inductance values and capacitance values of which are different from each other.

Also, it is suitable to replace the inductance elements 5a and 5b by a common-mode choke coil. A common-mode choke coil is not operated as an impedance element, since directions of magnetic fields produced in the respective windings thereof are directed opposite to each other with respect to a normal mode signal, so that the produced magnetic fields may cancel with each other. On the other hand, since directions of magnetic fields produced in the respective windings of the common-mode choke coil are directed to the same direction with respect to a common-mode signal, the produced magnetic fields may be emphased with each other, which produces a large inductive impedance. As a result, this common-mode choke coil may represent such an effect capable of blocking the penetration of the signal through the common-mode choke coil.

It should also be noted that the communication transformer according to the present invention may be used in various sorts of transfer line communicating operations such as a LAN communicating operation under optimum condition. More specifically, this communication transformer may be optimally applied to such a transfer line communication case that transfer path conditions are very deteriorated, for example, an electric power line communication.

In the case that a half way portion of an additional winding which does not contribute in a signal transfer operation is not only grounded, but also, for instance, three sorts of windings constituted by a reception-purpose winding, a transmission-purpose winding, and a transfer path-purpose winding are wound, even when a half way portion of any one of these 3 windings is grounded, a similar effect may be achieved. For instance, since the transmission-purpose winding and the transfer path-purpose winding are arranged on both sides of the reception-purpose winding by sandwiching therebetween this reception-purpose winding, a stray capacitance may be similarly decreased, and thus, the common-mode noise rejection may be improved.

FIG. 6 indicates an equivalent circuit diagram as to such a case that three sets of a transmission-purpose winding, a reception-purpose winding, and a transfer path-purpose winding are wound on a magnetic core 1. In this drawing, reference numeral 2b indicates the transmission-purpose winding, reference numeral 3b shows the reception-purpose winding, and reference numeral 4b represents the transfer path-purpose winding. A center tap 5 which constitutes a half way portion of the reception-purpose winding 3b is grounded. As a result, it is possible to suppress that a stray capacitance is produced between the transmission-purpose winding 2b which constitutes a primary-sided winding and the transfer path-purpose winding 4b, and furthermore, impedances viewed from the ground can be made equal to each other. As a consequence, the common-mode noise rejection can be improved without lowering the electrical balance. Also, in this case, since all of the windings can be employed in the transmission operation and the reception operation, there is a merit that an efficiency can be increase.

Embodiment Mode 2

Figure 7:
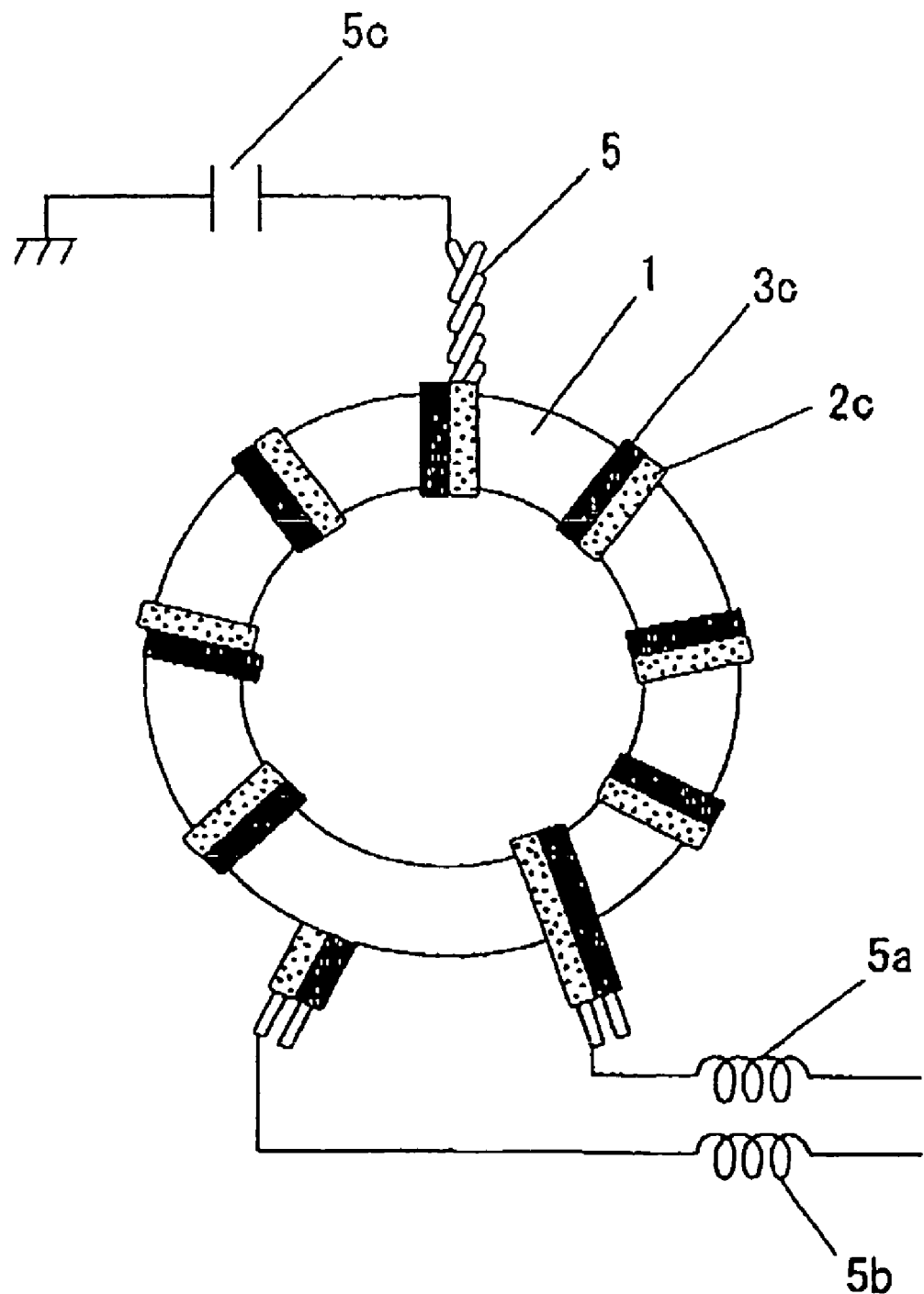
FIG. 7 is a front view of a communication transformer according to an embodiment mode 2 of the present invention.
Figure 8:
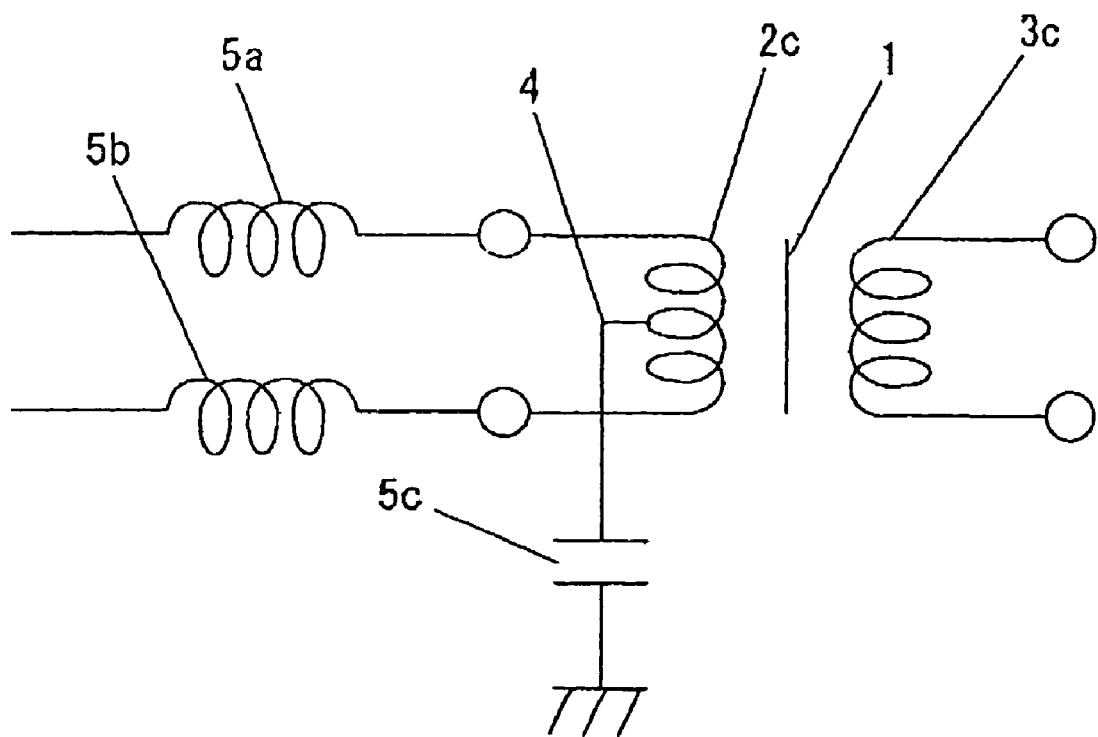
FIG. 8 is an equivalent circuit diagram of the communication transformer shown in FIG. 7.

FIG. 7 is a front view of a communication transformer according to an embodiment 2 of the present invention. FIG. 8 is an equivalent circuit of the communication transformer shown in FIG. 7. Reference numeral 5c shows a capacitance element, and reference numerals 2 and 3 represent transfer-purpose windings. FIG. 7 indicates such a communication transformer that there are two pieces of transfer-purpose windings which are wound on a magnetic core 1, a center tap 5 constituting a half way portion of any one of these transfer-purpose windings is connected via the capacitance element 5c to a constant potential. Also, inductance elements 5a and 5b are connected to both terminals of the transfer-purpose winding 2c respectively. As compared with such a case that an additional winding, or the like, is not employed between the transfer-purpose windings 2c and 3c, an effect capable of reducing the stray capacitance produced between the transfer-purpose windings 2c and 3c is decreased. However, as indicated in FIG. 7, since these transfer-purpose windings 2c and 3c are connected via the capacitance element 5c to the constant potential, a resonant frequency can be generated. Since this resonant frequency is set to be in the vicinity of a frequency range for transferring signals by the communication transformer, a common-mode rejection ratio may be increased.

With respect to a common-mode signal applied to the transfer-purpose winding 2c, both a parallel impedance of the inductor elements 5a and 5b, and also, the capacitance element 5c form a series-resonant circuit, and a ground impedance with respect to the common-mode signal becomes minimum at the series-resonant frequency. At this time, since a common-mode signal component which is transferred via the transfer-purpose winding 3c becomes also minimum, the common-mode rejection ratio becomes maximum. As a consequence, since the inductance elements 5a and 5b, and the capacitance element 5c are adjusted in such a manner that the series resonance may occur in the vicinity of the transfer frequency range, the communication transformer whose common-mode rejection ratio is high can be realized in the signal transfer range.

Embodiment Mode 3

Figure 9:
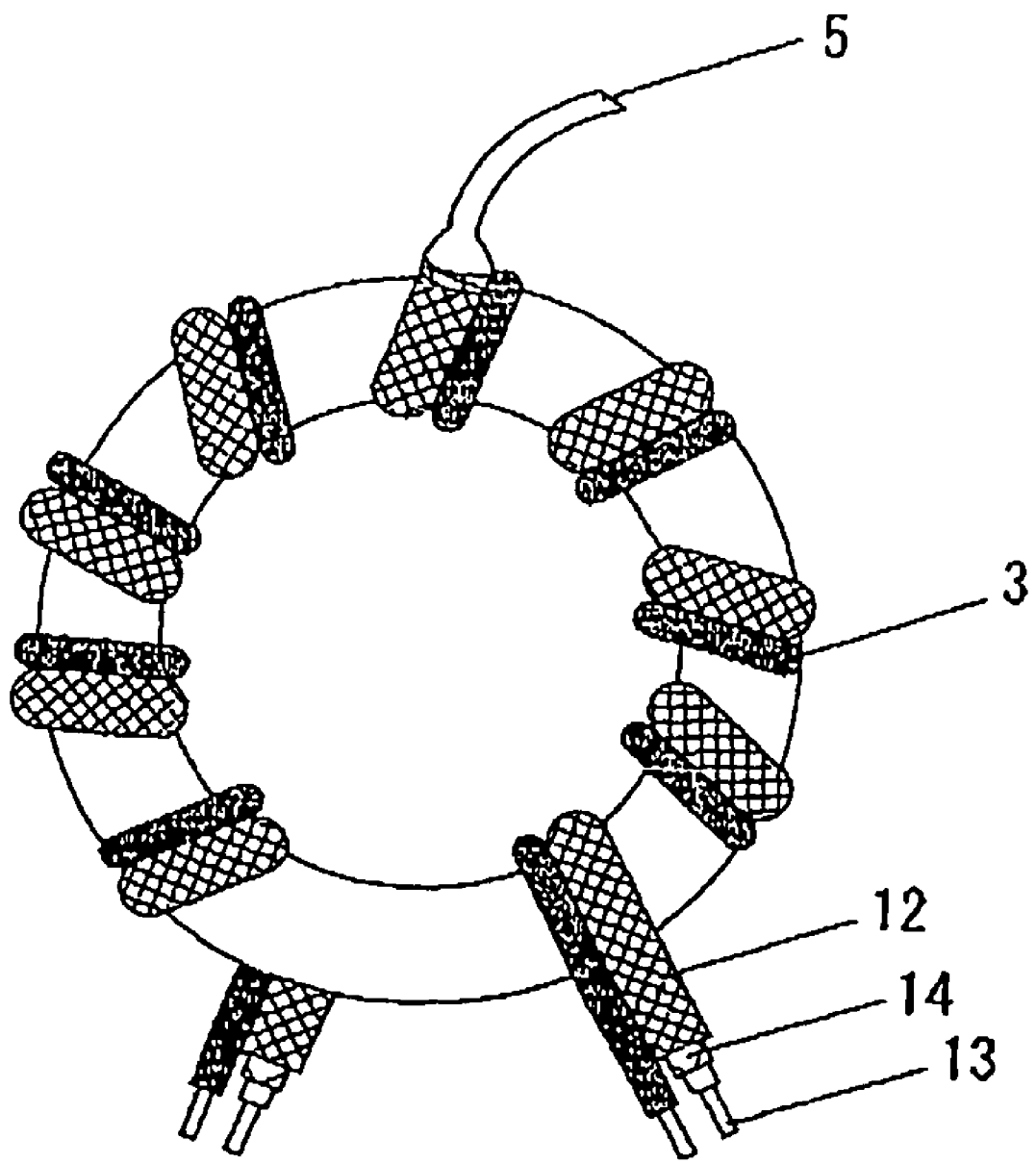
FIG. 9 is a front view of a communication transformer according to an embodiment mode 3 of the present invention.

FIG. 9 is a front view of a communication transformer according to an embodiment mode 3 of the present invention. In the drawing, there is shown the communication transformer which is used in high-speed electric power line communications so as to transfer signals in a frequency range from 1 MHz to several tens MHz. The communication transformer shown in FIG. 9 is different from the communication transformer indicated in the embodiment mode 1, and employs such an arrangement that a shielded line is used as both one of transfer-purpose windings and an additional winding.

In this drawing, reference numeral 12 shows a shielded line, reference numeral 13 represents a center conductor, and reference numeral 14 denotes a shielding conductor. Both a transfer-purpose winding 2 and an additional winding 4 are formed in an integral body by employing the shielded line conductor 14. The center conductor 13 of the shielded line 12 and the shielding conductor 14 correspond to the transfer-purpose winding 2 and the additional winding 4, respectively. A transfer-purpose winding 3 and the shielding conductor 12 are wounded on the magnetic core 1 in such a manner that the transfer-purpose winding 3 and the shielded line 12 are arranged side by side, and the distance between these winding and line continuously becomes constant. A center tap 5 is provided at such a position of the shielded line 12 in which the winding number and the wining length are subdivided by 2, namely at a shielding conductor portion of a half way portion thereof. The center tap 5 is connected to a constant potential, and is connected to the ground potential in order that a process operation by a simple circuit can be carried out. As explained above, only two pieces of the shielded line 12 and the transfer-purpose winding 3 are merely wound on the magnetic core 1. However, as a point of its structure, the structure of this communication transformer is identical to the above-explained structure of the embodiment model, namely, both two pieces of the transfer-purpose windings and one piece of the additional winding are wound on the magnetic core. Similar to the embodiment mode 1, while the shielded line 12 and the transfer-purpose winding 3 are previously arranged in such a manner that an interval between the shielded line 12 and the transfer-purpose winding 3 becomes an equi-distance, the arranged line/winding are wound on the magnetic core 1, so that the communication transformer can be manufactured in a simple manner.

In this communication transformer, since the transfer-purpose winding 2 (corresponding to center conductor 13) is capacitively coupled to the additional winding 4 (corresponding to shielding conductor 14) under close condition, common-mode components can be fed back to the noise source in a more effective manner. Also, since the center taps is provided at a half way portion of the additional winding 4, it is possible to avoid lowering of a electrical balance of the respective transfer-purpose windings, which is caused by the ground. In the communication transformer of this embodiment mode 3, both the transfer-purpose winding 3 and the shielded line 12 are arranged in the parallel manner. Alternatively, the transfer-purpose winding 3 and the shielded line 12 may be arranged in a twisted-line shape. In this alternative case, there is an advantage that magnetic coupling conditions between the transfer-purpose windings may be improved. Also, as apparent from the foregoing description, since one piece of the shielded line 12 is used as both the transfer-purpose winding 2 and the additional winding 4, there are such merits that the communication transformer can be manufactured in an easy manner and the manufacturing precision thereof can be increased.

Figure 10:
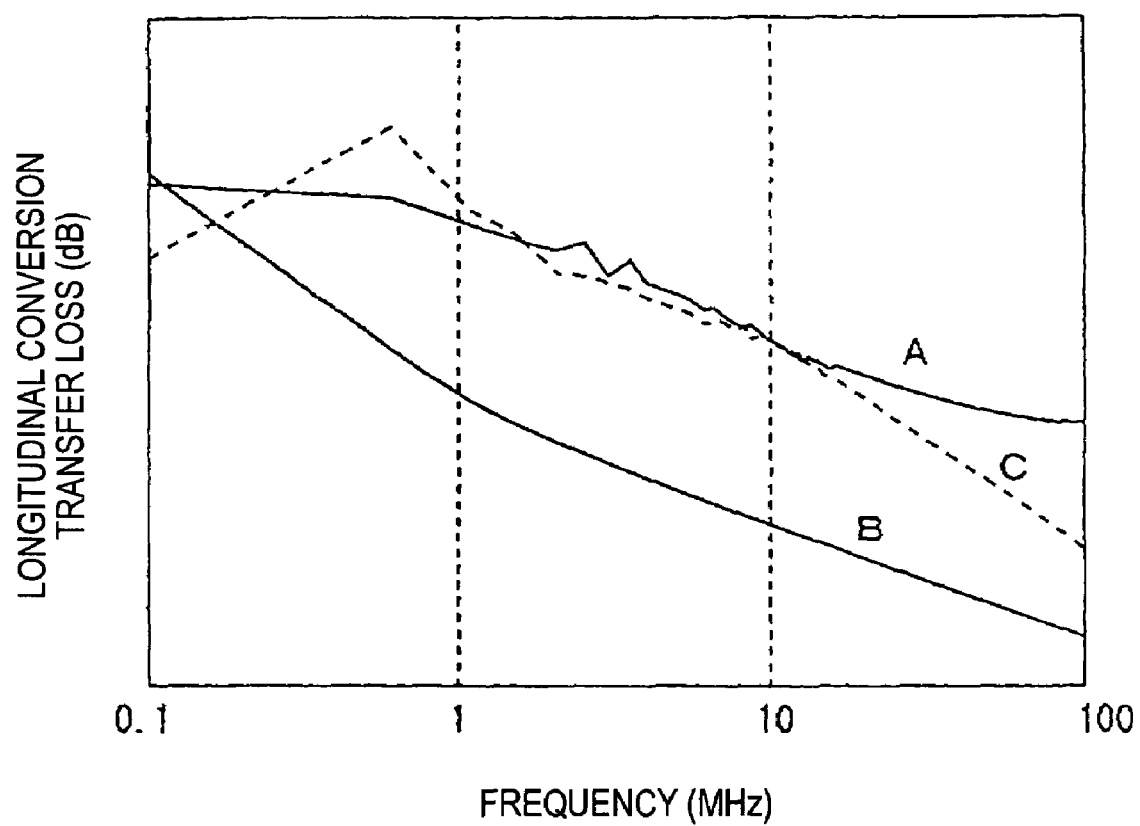
FIG. 10 is a performance characteristic diagram of the communication transformer according to the embodiment mode 3 of the present invention.
Figure 11:
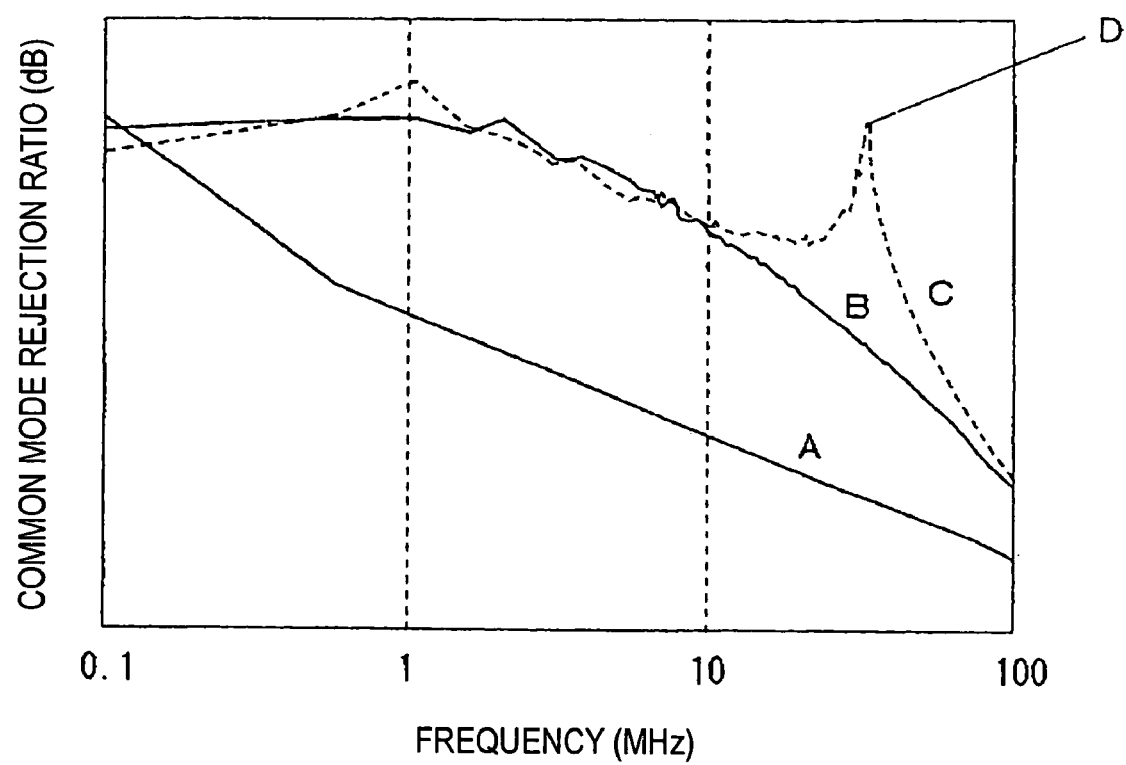
FIG. 11 is a performance characteristic diagram of the communication transformer according to the embodiment mode 3 of the present invention.

FIG. 10 and FIG. 11 are performance characteristic diagrams as to the communication transformer according to the embodiment mode 3 of the present invention, namely are graphic representations for graphically representing longitudinal-direction conversion transfer loss performance in which a ratio (decibel value) of a normal mode signal appearing on the transfer-purpose winding 3 to a common-mode signal applied to the transfer-purpose winding 3 is plotted every frequency when the common-mode signal is applied to this transfer-purpose winding 3 of the communication transformer. In FIG. 10, a curve "A" shows such a characteristic that the communication transformer indicated in FIG. 9 is used while the additional winding 4 is not grounded; a curve "B" indicates such a characteristic that not a half way portion thereof, but one terminal of the additional winding 4 is grounded in accordance with the conventional system; and a curve "C" shows such a characteristic that the center tap 5 of the additional winding 4 is grounded. In the characteristic curve "B" where one terminal of the additional winding 4 is grounded, the following fact can be revealed. That is, since the electrical balance is lowered, the longitudinal-direction conversion transfer loss is largely deteriorated. In contrast thereto, in the characteristic curve "C" where the center tap 5 is grounded, the following fact can be revealed. That is, the longitudinal-direction converting loss performance is not so lowered, but the electrical balance is maintained.

Also, in FIG. 11, common-mode rejection ratio (CMRR) is represented in a graph, in which a ratio (decibel value) of a common-mode signal which is transferred through the transfer-purpose winding 3 to a common-mode signal which is applied to the center conductor 13 in the case that the common-mode signal is applied to the center conductor 13 is plotted every frequency. This graph represents that the larger a value of an ordinate of this graph becomes, the higher the performance capable of rejecting the common-mode signal is increased. In FIG. 11, a curve "A" shows such a characteristic that the communication transformer of the present invention is used while the additional winding 4 is not grounded; a curve "B" indicates such a characteristic that the additional winding 4 is grounded in accordance with the conventional system; and a curve "C" shows such a characteristic that the center tap 5 which constitutes the half way portion of the additional winding 4 is grounded. As apparent from FIG. 11, since the communication transformer is grounded via the center tap 5, the common-mode rejection performance is not deteriorated. It should also be noted that symbol "D" shows a maximal point, and the common-mode rejection performance becomes maximum at a frequency of this maximal point "D." At this time, as previously explained in the embodiment mode 1, the frequency of this maximal point "D" can be changed by adjusting a series-resonant in such a manner that an inductance element is connected to the transfer-purpose winding 3, and/or a capacitance element is connected to the additional winding 4. As a consequence, the common-mode rejection performance can be increased in correspondence with the transfer frequency range. As previously explained, in accordance with the communication transformer of this embodiment mode 3, the common-mode rejection performance can be improved without lowering the electrical balance.

Figure 12:
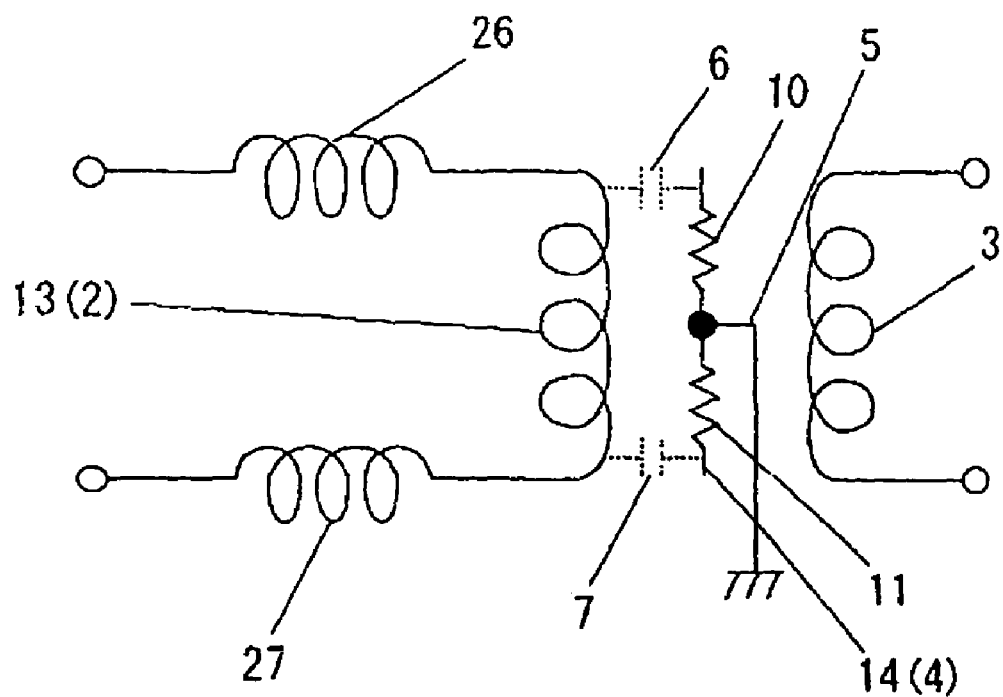
FIG. 12 is an equivalent circuit diagram of a communication transformer according to an embodiment mode 3 of the present invention.

FIG. 12 is an equivalent circuit diagram of the communication transformer according to the embodiment mode 3 of the present invention. Reference numerals 26 and 27 indicate leakage inductances which are produced in the transmission-purpose winding 2. Since the leakage inductances 26, 27, and the stray capacitances 6, 7 constitute a series-resonant circuit with respect to the common-mode signal, a common-mode impedance with respect to the ground potential becomes a minimal value at the series-resonant frequency, a feedback of the common-mode signal to the signal source side becomes maximum, and also, a transfer operation of the common-mode signal to the transfer-purpose winding 3 becomes minimal, which correspond to the maximal point of the common-mode rejection ratio indicated by symbol "D" of FIG. 11. In the communication transformer of the present invention, a thickness of an insulating cover and a winding length as to the center conductor 13 are optimized in such a manner that the series-resonant frequency is set to be in the vicinity of the transfer frequency range so as to adjust the capacitance values of the stray capacitances 6 and 7. As a result, higher common-mode rejection performance can be obtained in the transfer frequency range. It should also be noted that the stray capacitances may be alternatively adjusted by employing insulating materials having different dielectric constants, or by connecting a capacitor functioning as a capacitance element in series to the center tap 5. Although the leakage flux has been used in this embodiment mode 3, an inductor element may be alternatively connected in series to the center tap 5 within such a range that an adverse influence given to the transfer signals can be allowed. Further, if a common-mode choke inductor is employed as the inductor element, then there is a further merit that the series-resonant circuit may be arranged without giving the adverse influence to such a transfer signal corresponding to the normal mode. Also, the communication transformer may be alternatively and suitably arranged as follows. That is, while these capacitance elements and inductance element are designed to be adjustable, after the communication transformer is manufactured, stray capacitances are measured. Thereafter, the resonant frequency may be alternatively adjusted by replacing the above-described capacitance elements and inductance element by other capacitance elements and inductance element having different values from those of the first-mentioned capacitance elements and inductance element in such a manner that the resonant frequency becomes close to the transfer frequency range.

Embodiment Mode 4

Figure 13:
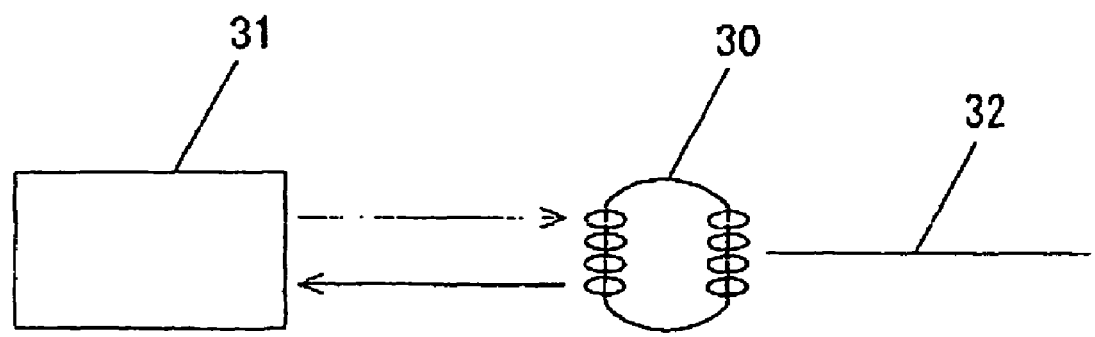
FIG. 13 is a structural diagram of a communication interface module according to the embodiment mode 4 of the present invention.
Figure 14:
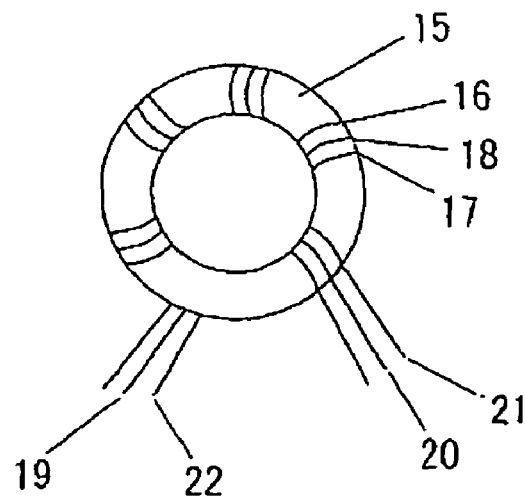
FIG. 14 is the structural diagram of the communication transformer of the prior art.
Figure 15:
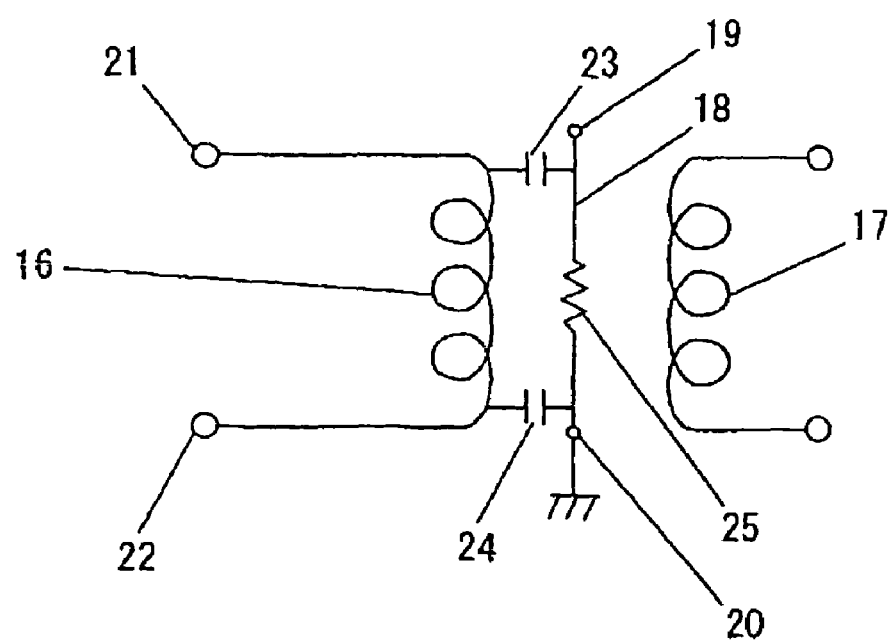
FIG. 15 is the equivalent circuit diagram of the communication transformer of the prior art.
Figure 16:
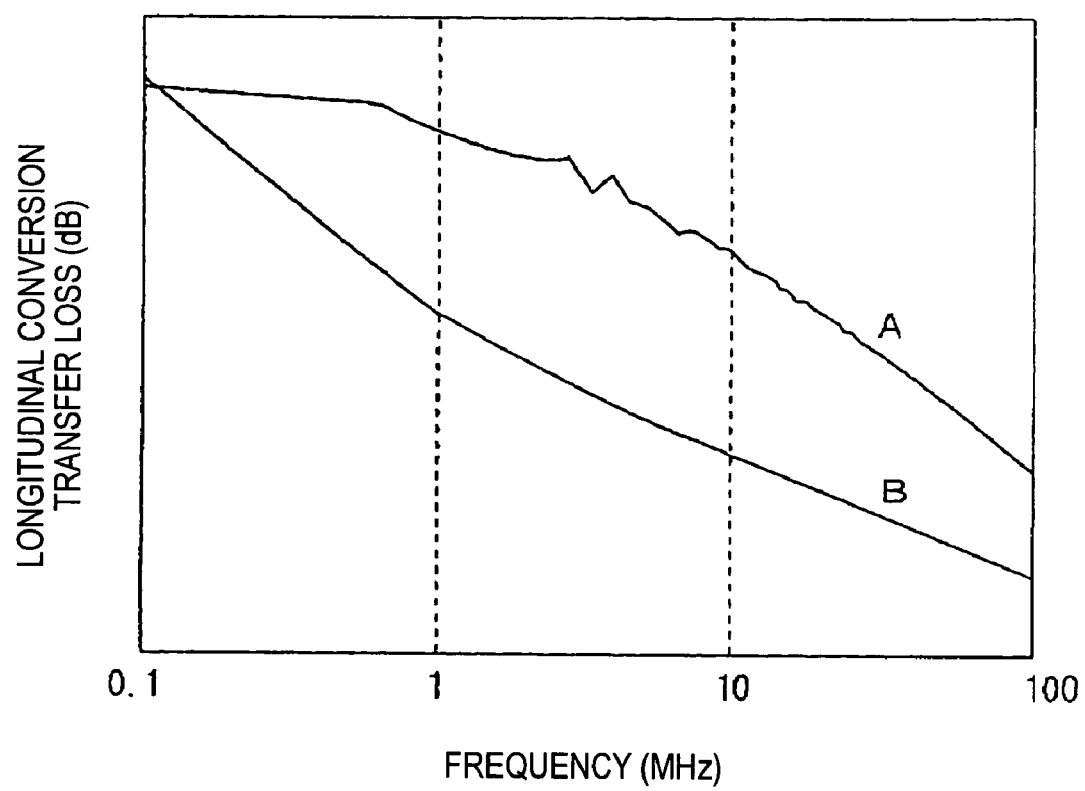
FIG. 16 shows the conversion transfer loss performance diagram of the conventional communication transformer.

FIG. 13 is a structural diagram of a communication module according to an embodiment mode 4 of the present invention. In this drawing, reference numeral 31 shows transmission/reception unit. The transmission/reception unit 31 processes a signal and controls transmitting/receiving operations. Reference numeral 30 indicates a transformer, which corresponds to any one of the transformers explained in the embodiment mode 1 to the embodiment mode 3. Reference numeral 32 shows a transfer path. The transformer 30 is arranged between the transmission/reception unit 31 and the transfer path 32.

The communication module is arranged in the above-described manner and then is installed in a communication facility. As a result, such a communication module having higher common-mode rejection performance and a higher transfer efficiency can be arranged without lowering of the electrical balance. In this case, such a communication interface module may be alternatively arranged in such a manner that electronic elements required at front and rear sides of the communication transformer, and transfer paths and a transmission/reception unit, which are connected to the communication transformer, have been mounted on a single board. Alternatively, one module on which only a portion of these structural elements has been mounted, and another module on which the remaining structural elements have been mounted may be stored in housings which are easily connectable to each other. Further, a portion of these structural elements may be alternatively and suitably integrated as an integrated circuit. As previously explained, since the structural elements are moduled as the interface modules, when these interface modules are actually assembled, various sorts of adjusting operations are no longer required. There are such merits that user-friendly products may be manufactured, and entire cost thereof may be reduced.

The communication transformer according to the present invention owns such an effect that the large common-mode rejection ratio can be obtained, while the electrical balance of the communication transformer is not lowered. The communication transformer may also be utilized as a communication transformer which is employed in a LAN for performing a communication operation while a non-shielded twisted pair cable is used as a transfer path.

This application is based upon and claims the benefit of priority of Japanese Patent Application No. 2003-382189 filed on Nov. 12, 2003, the contents of which are incorporated herein by reference in its entirety.

What is claimed is:

1. A communication transformer comprising:
a single magnetic core; and
a plurality of conductors which are wound only on said single magnetic core in a spiral shape and are mutually insulated from each other,
wherein said plurality of conductors includes:
a plurality of transfer-purpose conductors for transferring a signal;
an additional conductor which does not transfer said signal and which has a first end and a second end;
wherein a portion of said additional conductor between said first end and said second end is connected to a constant potential,
wherein said portion of the additional conductor corresponds to a portion thereof where an impedance of said additional conductor is subdivided by approximately two, and
wherein both said first end and said second end are floated.

2. A communication transformer as claimed in claim 1 wherein both said transfer-purpose conductor and said additional conductor correspond to electric wires.

3. A communication transformer as claimed in claim 1 wherein said additional conductor is provided between said transfer-purpose conductors.

4. A communication transformer as claimed in claim 3, wherein said plurality of conductors are comprised of a plurality of additional conductors; and
one of said transfer-purpose conductors is provided between said plurality of additional conductors.

5. A communication transformer as claimed in claim 3 wherein said additional conductor has a sectional area which is larger than a sectional area of said transfer-purpose conductors.

6. A communication transformer as claimed in claim 5 wherein any one of said transfer-purpose conductors which is located adjacent to each other via said additional conductor has a sectional area which is larger than a sectional area of the other of said transfer-purpose conductor.

7. A communication transformer as claimed in claim 1 wherein at least one of said transfer-purpose conductors corresponds to a center conductor of a shielded line; and
said additional conductor corresponds to a shielding conductor which covers an outer circumference of said center conductor.

8. A communication transformer as claimed in claim 1 wherein said transfer-purpose conductors and said additional conductor are provided on said magnetic core in a substantially equi-interval.

9. A communication transformer as claimed in claim 1 further comprising:
inductance elements which are connected to both terminals of at least one of said transfer-purpose conductors.

10. A communication transformer as claimed in claim 9 wherein a transfer frequency range used to transfer said signal is set to be in the vicinity of a series-resonant frequency defined by both a stray capacitance produced between the transfer-purpose conductor to which said inductance element is connected and said additional conductor, and said inductance element.

11. A communication transformer as claimed in claim 10 further comprising:
a capacitance element which connects said portion of said additional conductor to said constant potential; and
said transfer frequency range is set to be in the vicinity of a series-resonant frequency defined by said stray capacitance, said inductance element, and said capacitance element.

12. A communication transformer as claimed in claim 10 wherein said inductance element can be adjusted in such a manner that said series-resonant frequency is set to be in the vicinity of the transfer frequency range.

13. A communication transformer as claimed in claim 9 wherein an inductance of said inductance element corresponds to a leakage inductance of said transfer-purpose conductor.

14. A communication transformer as claimed in claim 9 wherein said inductance element corresponds to a common-mode choke coil.

15. A communication transformer as claimed in claim 2 further comprising:
a capacitance element which connects said portion of said additional conductor to said constant potential.

16. A communication transformer as claimed in claim 1 wherein said portion of said additional conductor is connected to the ground potential.

17. A communication interface module comprising:
a communication transformer comprising: a single magnetic core; and a plurality of conductors which are wound only on said single magnetic core in a spiral shape and are mutually insulated from each other, wherein said plurality of conductors includes: a plurality of transfer-purpose conductors for transferring a signal; and an additional conductor which does not transfer said signal and which has a first end and a second end, wherein a portion of said additional conductor between said first end and said second end is connected to a constant potential, wherein said portion of the additional conductor corresponds to a portion thereof where an impedance of said additional conductor is subdivided by approximately two, and wherein both said first end and said second end are floated;
a transmission-and-reception unit for processing said signal; and
a transfer path connected via said communication transformer to said transmission-and-reception unit, for transferring therethrough said signal.

18. A communication transformer comprising:
a single magnetic core; and
a plurality of conductors which are wound only on said single magnetic core in a spiral shape and are mutually insulated from each other;
wherein said plurality of conductors includes:
a plurality of transfer-purpose conductors for transferring a signal,
an inductance element connected to each of both terminals of at least one of said transfer-purpose conductors and
an additional conductor which does not transfer said signal and which has a first end and a second end, wherein a portion of said additional conductor between said first end and said second end is connected to a constant potential, wherein said portion of the additional conductor corresponds to a portion thereof where an impedance of said additional conductor is subdivided by approximately two, and wherein both said first end and said second end are floated.

19. A communication transformer as claimed in claim 1 wherein said communication transformer is operable to perform power line communication.

20. A communication transformer as claimed in claim 1 wherein said communication transformer is operable to perform communication in a frequency range of 1-100 MHz.

* * * * *